(12) United States Patent
Mancini et al.

(10) Patent No.: US 6,852,454 B2
(45) Date of Patent: Feb. 8, 2005

(54) MULTI-TIERED LITHOGRAPHIC TEMPLATE AND METHOD OF FORMATION AND USE

(75) Inventors: David P. Mancini, Fountain Hills, AZ (US); Douglas J. Resnick, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 234 days.

(21) Appl. No.: 10/174,464

(22) Filed: Jun. 18, 2002

(65) Prior Publication Data

US 2003/0232252 A1 Dec. 18, 2003

(51) Int. Cl.⁷ .............................. G03F 9/00; G03C 5/00
(52) U.S. Cl. .......................... 430/5; 430/311; 430/319; 430/320; 430/321; 430/322; 430/296
(58) Field of Search ...................... 430/5, 311, 320–322, 430/319, 296

(56) References Cited

U.S. PATENT DOCUMENTS

| | | |
|---|---|---|
| 4,124,473 A | 11/1978 | Lehmann et al. |
| 4,434,224 A | 2/1984 | Yoshikawa et al. |
| 4,591,547 A | 5/1986 | Brownell |
| 5,126,006 A | 6/1992 | Cronin et al. |
| 5,667,940 A | 9/1997 | Hsue et al. |
| 6,013,417 A | 1/2000 | Sebesta et al. |
| 2003/0162406 A1 * | 8/2003 | Gehoski et al. ............. 438/725 |
| 2004/0023126 A1 * | 2/2004 | Mancini et al. ................ 430/5 |
| 2004/0033424 A1 * | 2/2004 | Talin et al. .................... 430/5 |

FOREIGN PATENT DOCUMENTS

DE          4432725 C1      1/1996

OTHER PUBLICATIONS

Lochel et al., "Galvanoplated 3D structures for micro systems," Microelectronic Engineering 23 (1994) pp. 455–459.

* cited by examiner

Primary Examiner—Geraldine Letscher

(57) ABSTRACT

This invention relates to semiconductor devices, microelectronic devices, microelectromechanical devices, microfluidic devices, photonic devices, and more particularly to a multi-tiered lithographic template, a method of forming the multi-tiered lithographic template and a method for forming devices with the multi-tiered lithographic template. The multi-tiered lithographic template (10/10') is formed having a first relief structure and a second relief structure, thereby defining a multi-tiered relief image. The template is used in the fabrication of a semiconductor device (40) for affecting a pattern in device (40) by positioning the template in close proximity to semiconductor device (40) having a radiation sensitive material formed thereon and applying a pressure to cause the radiation sensitive material to flow into the multi-tiered relief image present on the template. Radiation is then applied through the multi-tiered template so as to further cure portions of the radiation sensitive material and further define the pattern in the radiation sensitive material. The multi-tiered template is then removed to complete fabrication of semiconductor device (40).

52 Claims, 4 Drawing Sheets

MULTI-TIERED LITHOGRAPHIC TEMPLATE AND METHOD OF FORMATION AND USE

FIELD OF THE INVENTION

The present invention relates to semiconductor devices, microelectronic devices, micro electro mechanical devices, microfluidic devices, photonic devices, and more particularly to a lithographic template, a method of forming the lithographic template to include a multi-tiered structure and a method for forming semiconductor devices with the multi-tiered lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease well into the submicron range to the 100 nanometer range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL) has been shown to be capable of patterning lines as small as 20 nm.

SFIL templates are typically made by applying a layer of chrome, 80–100 nm thick, on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Overall, SFIL techniques benefit from their unique use of photochemistry, the use of ambient temperatures, and the low pressure required to carry out the SFIL process. During a typical SFIL process, a substrate is coated with an organic planarization layer, and brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or crosslinked, at room temperature by illuminating through the template. The light source typically uses ultraviolet radiation. A range of wavelengths (150 nm–500 nm) is possible, however, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen reactive ion etch (RIE) to form a high-resolution, high aspect-ratio feature in the organic layer and planarization layer.

The distinction between a lithographic mask and a lithographic template should be noted. A lithographic mask has a pattern comprised of opaque and transparent regions and is used as a stencil to impart an aerial image of light into a photoresist material. A lithographic template has a relief image etched into its surface, creating a form or mold. In SFIL, a pattern is defined when a photocurable liquid flows into the relief image and is subsequently cured. The attributes necessary for masks and templates, therefore are quite different.

SFIL technology has been demonstrated to resolve features as small as 20 nm. As such, a wide variety of feature sizes may be drawn on a single wafer. Certain problems exist though with this SFIL template fabrication methodology as described above. One such problem with prior art processes is that while dimensionally uniform features are created, two-dimensional tiered structures are not able to be created using SFIL technology. Typically, single tier templates are formed using SFIL technology, that are one layer deep and thus considered to have only one "tier". There exists a need to create multi-tiered structures for use in many types of applications including microelectronic or MEMS applications. Furthermore, this multi-tiered structure would provide a layered resist profile useful for T-gate formation, diffractive optical elements, optical grating couplers, and other structures.

There also exist problems with respect to uniform etching of the quartz template when only a chrome hard mask is utilized. It should be noted that etch depth on the template determines ultimately the thickness of the photocured resist layer on a wafer, and is very critical as a result. More specifically, the problem exists with respect to micro-loading effects on small features (<200 nm) in terms of etch uniformity. It is well know that small (<200 nm) features etch more slowly than larger features, resulting in a non-uniformity in both critical dimension and etch depth across the template. Due to micro-loading effects during the etch, small features will not etch completely, nor as deeply as large features. More specifically, the etch depth of sub-200 nm lines is shallower than for larger features. This results in a resist image which is non-uniform in thickness from large to small features. Because of this, three specific negative consequences result: (i) poor line width control; (ii) non-uniform etch depth (resulting in poor resist thickness uniformity); and (iii) rounded resist profiles.

Furthermore, a problem exists with electron-beam writing of the template and the inspection of the template subsequent to fabrication. In particular, a conductive layer must be present, in order to avoid charge build-up during electron-beam exposure. In addition, inspectability is not readily achievable due to the template being comprised of a single material. Typical inspection systems use either light (ultraviolet or deep ultraviolet) or electrons to determine feature size and detect unwanted defects on the template.

Light-based systems require a difference in reflection or index of refraction between patterned and unpatterned areas of the template to provide good image contrast. Likewise, an electron-based system requires a difference in atomic number between patterned and unpatterned areas of the template. To overcome this problem, multiple materials having either different optical properties or different atomic numbers would allow for inspection, a necessity for sub-100 nm features.

Accordingly, it would be beneficial to provide for a template in which fabrication of a multi-tiered structure is achievable.

It is a purpose of the present invention to provide for an improved multi-tiered lithographic template, a method of fabricating the improved multi-tiered lithographic template, and a method for making semiconductor devices with the improved multi-tiered lithographic template in which a multi-tiered structure is achieved.

It is a purpose of the present invention to provide for an improved multi-tiered lithographic template, a method of fabricating the improved multi-tiered lithographic template, and a method for making semiconductor devices with the improved multi-tiered lithographic template in which inspection for sub-micron structures is achievable.

SUMMARY OF THE INVENTION

This invention relates to semiconductor devices, microelectronic devices, micro electro mechanical devices, microfluidic devices, photonic devices, and more particularly to a multi-tiered lithographic template, a method of forming the multi-tiered lithographic template and a method for forming devices with the multi-tiered lithographic template. Disclosed is a multi-tiered lithographic template including a substrate, and a plurality of relief structures, which form a multi-tiered structure. The multi-tiered lithographic template is formed by providing a transparent substrate having formed therein or there upon an uppermost surface a first patterned relief structure, and additional patterned relief structure(s), thereby defining a multi-tiered lithographic template. The plurality of patterned relief structures are formed using standard lithographic patterning techniques, or in the alternative, directly imageable dielectric processing techniques.

Additionally, disclosed is a method for making a device with the multi-tiered lithographic template as provided, including the steps of providing a substrate, applying a radiation sensitive material to the semiconductor substrate, providing a multi-tiered lithographic template as previously disclosed, positioning the multi-tiered lithographic template in contact with the radiation sensitive material, applying pressure to the template so that a pattern is created in the radiation sensitive material, transmitting radiation through the multi-tiered lithographic template to expose at least a portion of the radiation sensitive material on the substrate, thereby further affecting the pattern in the radiation sensitive material, and removing the multi-tiered template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

Figure 1:
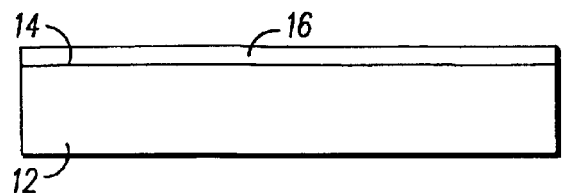
FIGS. 1–7 illustrate in cross-section views, steps in a first disclosed process for fabricating a multi-tiered lithographic template in accordance with the present invention.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENT

The present invention relates to fabrication of a multi-tiered lithographic template for use in Step and Flash Imprint Lithography (SFIL). It is proposed herein that a plurality of layers of materials be deposited on a substrate surface, thereby forming a multi-tiered lithographic template. It is anticipated by this disclosure that the method for forming a multi-tiered lithographic template according to the present invention includes forming the multi-tiered lithographic template using standard lithographic processing steps, as illustrated in FIGS. 1–7, or using directly imageable dielectric processing steps, as illustrated in FIGS. 8–11. It is also anticipated by this disclosure that a combination of the disclosed methods can be utilized for forming the multi-tiered lithographic template according to the present invention.

Referring more specifically to FIG. 1, illustrated is a first step in a first process of fabricating a multi-tiered lithographic template 10 according to the present invention. Illustrated is substrate 12, having a surface 14. Substrate 12 is disclosed as being comprised of a transparent material, such as a quartz material, a polycarbonate material, a pyrex material, a calcium fluoride ($CaF_2$) material, a magnesium fluoride material ($MgF_2$), or any other similar type of material, that is transparent to light. Substrate 12 is formed of a transparent material to allow for the passage therethrough of light.

As illustrated in FIG. 1, substrate 12, has deposited thereon surface 14, a first etch stop layer 16. First etch stop layer 16 is disclosed as formed of silicon nitride (SiN), silicon oxide ($SiO_2$), chromium (Cr), chromium oxide (CrO), aluminum oxide (AlO), aluminum nitride (AlN), chromium nitride (CrN), indium-tin-oxide (ITO), indium oxide (InO), tin oxide (SnO), zinc oxide (ZnO), cadmium oxide (CdO), copper aluminum oxide (CuAlO), copper gallium oxide (CuGaO), cadmium tin oxide (CdSnO), or any other transparent, or semi-transparent material, and combinations thereof. It should be understood that when certain materials are used for substrate 12 and the first patterning layer (discussed presently) which require specific etch processes, that first etch stop layer 16 is optional, and first patterning layer (discussed presently) is deposited directly on surface 14 of substrate 12.

Figure 2:
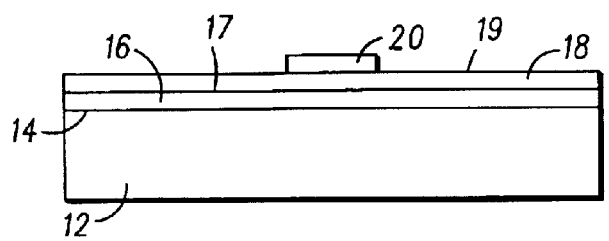

Referring now to FIG. 2, illustrated is substrate 12, having deposited thereon surface 14, first etch stop layer 16, a first patterning layer 18 and a patterned resist layer 20. First patterning layer 18 is disclosed as being formed of either an opaque or, transparent material (discussed presently), dependent upon overall design objective, as well as the material comprising first etch stop layer 16. More specifically, it is disclosed that the specific type of material utilized will have bearing on the resulting process steps that must be undertaken to complete fabrication of template 10. First patterning layer 18, having a surface 19, is formed on a surface 17 of first etch stop layer 16 by spin coating, sputtering, vapor deposition, or the like.

First patterning layer 18 is generally disclosed as being formed of a material having a different reflectivity (or index of refraction) or different atomic number than the material used for first etch stop layer 16. This difference in atomic number will provide for improved inspectability properties, as described presently. Transparent materials that are disclosed as being suitable for the fabrication of first patterning layer 18 are silicon dioxide ($SiO_2$), silicon nitride (SiN), silicon oxy-nitride (SiON), indium-tin-oxide (ITO), or the like. Opaque materials that are disclosed as being suitable for the fabrication of first patterning layer 18 are tungsten (W), tungsten silicide (WSi), tungsten silicon nitride (WSiN), tungsten alloys, tantalum (Ta), tantalum silicide (TaSi), tantalum silicon nitride (TaSiN), tantalum alloys, titanium (Ti), titanium alloys, molybdenum (Mo), molybdenum silicide (MoSi), molybdenum alloys, gold (Au), chrome (Cr), or the like. As previously stated, it should be noted that some patterning layers may not require an etch stop layer, since the substrate itself may perform sufficiently as an etch stop material. First patterning layer 18 may be used to assist charge dissipation during e-beam writing. In addition, first patterning layer 18 aids in SEM-based template inspection due to the varying materials utilized in the plurality of layers. First patterning layer 18 is disclosed as generally having a thickness dependent upon the desired aspect ratio to be imprinted into the photocurable resist layer. Specifically, first patterning layer 18 will need to have sufficient mechanical strength and durability to survive the stresses associated with template manufacturing and subsequent handling during the fabrication of the semiconductor devices with the completed lithographic template. Patterning layer 18 is therefore generally disclosed as having a thickness of between 10 and 5000 nm, and a preferred thickness of at least 50 nm.

Patterned resist layer 20 is patterned on uppermost surface 19 of first patterning layer 18 and provides for subsequent patterning of first patterning layer 18. Patterned resist layer 20, is patterned as illustrated in FIG. 2 by standard optical or e-beam patterning techniques. Patterned resist layer 20 is typically formed of a standard photoresist or electron-beam resist material well know in the art such as an organic polymer that is patterned so as to serve as a mask for the subsequent etching of first patterning layer 18.

Figure 3:
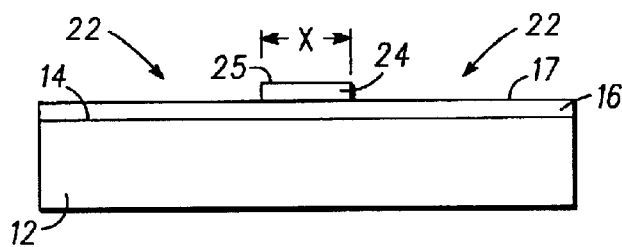

During fabrication of multi-tiered lithographic template 10, photoresist layer 20 serves as a mask for the etching therethrough of first patterning layer 18. As illustrated in FIG. 3, first patterning layer 18 is etched through to surface 17 of first etch stop layer 16, thereby exposing portions 22 of first etch stop layer 16. Etching of first patterning layer 18 is accomplished through standard wet or dry etch techniques. Finally, resist layer 20 is removed to expose first patterned layer 24, having a surface 25, and having a dimension "x" as illustrated in FIG. 3, where "x" is dependent upon the final application of multi-tiered lithographic template 10.

Figure 4:
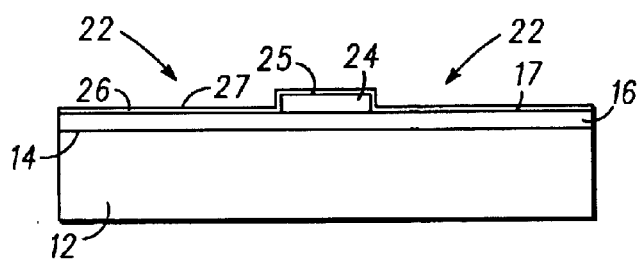

Referring now to FIG. 4, next a second etch stop layer 26 is deposited on first patterned layer 24 and on exposed portions 22 of first etch stop layer 16. Second etch stop layer 26 is disclosed as being formed of either an opaque or transparent material, dependent upon overall design objective, and the deposition of subsequent layers. More specifically, it is disclosed that the specific type of material utilized will have bearing on the resulting process steps that must be undertaken to complete fabrication of template 10. It is again anticipated that second etch stop layer 26 may be optional dependent upon the specific material utilized to form the previous layers, and subsequent layers. In the instance where second etch stop layer 26 is not required, a second patterning layer (discussed presently) will be formed directly on the surface of first patterned layer 24.

Transparent materials that are disclosed as being suitable for the fabrication of second etch stop layer 26 are chromium oxide ($Cr_xO_y$), aluminum oxide ($Al_xO_y$), aluminum nitride ($Al_xN_y$), chromium nitride ($Cr_xN_y$), silicon oxide ($SiO_2$), chromium (Cr), indium-tin-oxide (ITO), indium oxide ($In_xO_y$), tin oxide (SnO), zinc oxide (ZnO), cadmium oxide (CdO), copper aluminum oxide (CuAlO), copper gallium oxide (CuGaO), cadmium tin oxide (CdSnO), silicon nitride (SiN), combinations of these material or any other transparent, or semi-transparent conductive material, or the like, where "x" and "y" are positive numbers with values that indicate the relative concentration of an element in the aforementioned compounds. In a preferred embodiment x has a range of 0.1–1.0 and y has a range of 0.1–1.0. As an example, stoichiometric aluminum oxide is $Al_2O_3$. However, those skilled in the art realize that non-stoichiometric aluminum oxide films can be deposited and will serve the same purpose as the stoichiometric film. Opaque materials that are disclosed as being suitable for the fabrication of second etch stop layer 26 are chrome (Cr), or the like. Second etch stop layer 26 is formed to assist subsequent patterning of the remaining layers. Second etch stop layer 26 is disclosed as having a thickness dependent upon the etch selectivity to the patterning layer, as well as the charge conductivity of the material used. Specifically, second etch stop layer 26 will need to have a sufficiently low etch rate relative to the patterning layer in order to overcome any microloading effects. In addition, second etch stop layer 26 must have sufficient strength to survive the stresses associated with template manufacturing and subsequent handling during the fabrication of the semiconductor devices with the completed lithographic template. Second etch stop layer 26 is therefore generally disclosed as having a thickness in a range of 1–1000 nm, and a preferred thickness of at least 5 nm. Second etch stop layer 26 having a surface 27, is formed on a surface 25 of first patterned layer 24 by spin coating, sputtering, vapor deposition, or the like.

Figure 5:
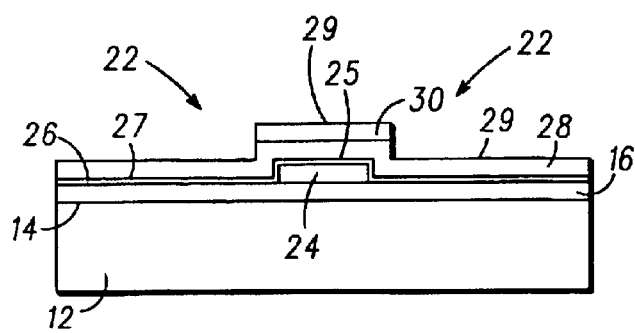

Referring now to FIG. 5, illustrated is substrate 12, having formed thereon first etch stop layer 16, first patterned layer 24, and second etch stop layer 26. There is additionally formed on surface 27 of second etch stop layer 26, a second patterning layer 28. Second patterning layer 28 is disclosed as being formed of either an opaque or transparent material, dependent upon overall design objective, as well as the material comprising second etch stop layer 26. More specifically, it is disclosed that the specific type of material utilized will have bearing on the resulting process steps that must be undertaken to complete fabrication of template 10.

First patterning layer 18 (previously introduced) and second patterning layer 28 are generally disclosed as being formed of materials having a different reflectivity (or index of refraction) or different atomic number than the material used for underlying first etch stop layer 16 or second etch stop layer 26, respectively. This difference in atomic number will provide for improved inspectability properties, as described presently. Transparent materials that are disclosed as being suitable for the fabrication of second patterning layer 28 are silicon dioxide (SiO$_2$), silicon nitride (SiN), silicon oxy-nitride (SiON), indium-tin-oxide (ITO), or the like. Opaque materials that are disclosed as being suitable for the fabrication of first patterning layer 18 and second patterning layer 28 are tungsten (W), tungsten silicide (WSi), tungsten silicon nitride (WSiN), tungsten alloys, tantalum (Ta), tantalum silicide (TaSi), tantalum silicon nitride (TaSiN), tantalum alloys, titanium (Ti), titanium alloys, molybdenum (Mo), molybdenum silicide (MoSi), molybdenum alloys, gold (Au), chrome (Cr), or the like. First patterning layer 18 and second patterning layer 28 may be used to assist charge dissipation during e-beam writing. In addition, patterning layers 18 and 28 aid in SEM-based template inspection due to the electron scattering nature of the varying materials utilized in the plurality of layers. Again, second patterning layer 28, similar to first patterning layer 18, is disclosed as generally having a thickness dependent upon the desired aspect ratio to be imprinted into the photocurable resist layer. Specifically, second patterning layer 28 will need to have sufficient mechanical strength and durability to survive the stresses associated with template manufacturing and subsequent handling during the fabrication is of the semiconductor devices with the completed lithographic template. Second patterning layer 28 is therefore generally disclosed as having a thickness of between 10 and 5000 nm, and a preferred thickness of at least 50 nm. Second patterning layer 28, having a surface 29, is formed on surface 27 of second etch stop layer 26 by spin coating, sputtering, vapor deposition, or the like.

Figure 6:
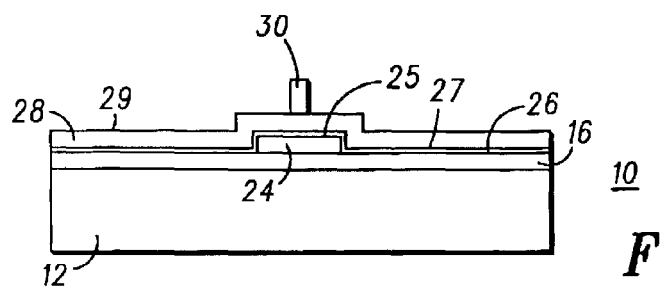
Figure 7:
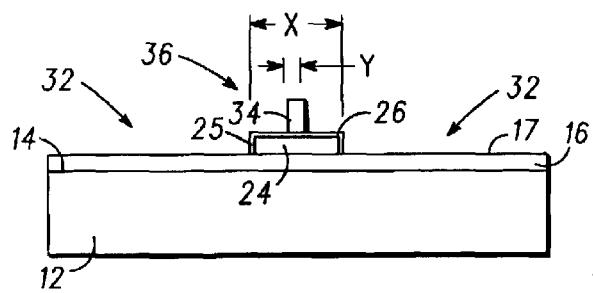

Referring now to FIGS. 6 and 7, illustrated is substrate 12, having formed thereon surface 14, first etch stop layer 16, first patterned layer 24, formed on surface 17 of first etch stop layer 16, second etch stop layer 26, formed on surface 25 of first patterned layer 24, second patterning layer 28 formed on surface 27 of second etch stop layer 26, and a patterned resist layer 30, formed on surface 29 of second patterning layer 28. More specifically, formed thereon surface 29 of second patterning layer 28 is a resist layer 30, which is patterned as illustrated in FIG. 6 by standard optical or e-beam patterning techniques. Resist layer 30 is typically formed of a standard photoresist or electron-beam resist material well know in the art such as an organic polymer that is patterned so as to serve as a mask for the subsequent etching of second patterning layer 28.

During fabrication, photoresist layer 30 serves as a mask for the etching therethrough of second patterning layer 28. As illustrated in FIG. 7, second patterning layer 28 is etched through to surface 27 of second etch stop layer 26, thereby exposing portions 32 of second etch stop layer 26. Etching of second patterning layer 28 is accomplished through standard wet or dry etch techniques. Next, second patterning layer 28 is overetched, if required, to provide for improved uniformity stopping against second etch stop layer 26.

Finally, to complete multi-tiered template 10, resist layer 30 is removed to reveal second patterned layer 34 having a dimension "y", where the dimension "x" of first patterned layer 24 is greater than dimension "y" of second patterned layer 24 (x>y). In the instance where second etch stop layer 26 is formed of an opaque material, removal of exposed portions 32 of second etch stop layer 26 would need to be conducted (as illustrated in FIG. 7) to allow for the subsequent passage therethrough of radiation. Fabrication of multi-tiered lithographic template 10 in this manner to include an opaque second etch stop layer 26 and second patterning layer 28 provides for minimization of residual photopolymer where it is not desired, enhanced inspectability, compatibility with current template repair techniques, resistance to aggressive cleans, amorphous/low surface roughness material for desirable pattern fidelity and transfer attributes, and improved template contrast due to the varying material layers.

FIG. 7 illustrates in cross-sectional view, a complete multi-tiered lithographic template 10 including substrate 12 having surface 14, first etch stop layer 16 overlying surface 14 of substrate 12, first patterned layer 24 having a surface 25 and a dimension "x", and second patterned layer 34 having a dimension "y", where "x" is greater than "y", overlying surface 27 of second etch stop layer 26. Upon completion, template 10 defines therein a multi-tiered relief image 36. It should be understood that while described is relief image 36 having dual tiers, defined by first patterned layer 24 and second patterned layer 34, anticipated by this disclosure is the fabrication and inclusion of additional stacked patterned layers to define a relief image having greater than two tiers. In the instance where additional layers are desired, the previously described patterning steps are repeated.

Referring now to FIGS. 8–11, illustrated in simplified cross-sectional views are steps in the fabrication of a multi-tiered lithographic template in which imageable dielectric processing techniques are utilized during fabrication. It should be noted that all components of FIGS. 8–11 that are similar to the components illustrated in FIGS. 1–7, are designated with similar numbers, having a prime added to indicate the different embodiment.

Disclosed is the inclusion of a resist, or patterning layer that once patterned is not used as an intermediate layer to effect pattern transfer to a second layer. Rather the patterning layer, after it is patterned, actually becomes the final template relief structure. This is made possible by judicious use of unique materials which combine the patternable characteristics of a photoresist, with the robust mechanical properties required of a template relief layer. These properties include high adhesive strength to the substrate, high modulus, high shear strength, and good thermal stability. Materials such as hydrogen silsesquioxane (HSQ) are patternable to a very high resolution and, once cured, form a very stable silicon oxide suitable as a template relief structure for imprinting. Materials with similar characteristics may be substituted for this application for HSQ. However, it should be noted that any such materials which are both irradiation sensitive and patternable, and possess adequate physical properties to behave as a template relief layer are unique and are the heart of this invention.

Figure 8:
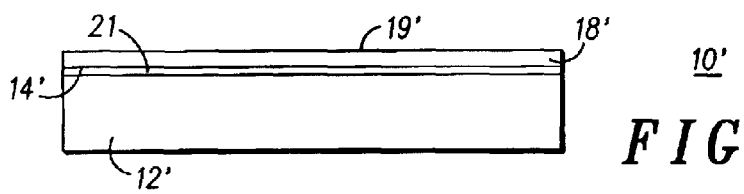
FIGS. 8–11 illustrate in cross-sectional views, steps in a second disclosed process for fabricating a multi-tiered lithographic template in accordance with the present invention.

Referring now to FIG. 8, illustrated is a substrate 12', formed generally similar to substrate 12 of FIGS. 1–7. A first patterning layer 18', in a preferred embodiment, is disclosed as being formed of an imageable dielectric material. More specifically, patterning layer is disclosed as being formed of an imageable oxide, such as hydrogen silsesquioxane (HSQ), marketed by Dow Corning as FOX-15®. In addition, patterning layer 18' could be formed of alternative imageable dielectric materials, such as an imageable nitride, or an imageable oxynitride. During template fabrication, patterning layer 18' is formed on surface 14' of substrate 12' and then baked at a low temperature, such as approximately 160° C., to remove any solvents present.

Figure 9:
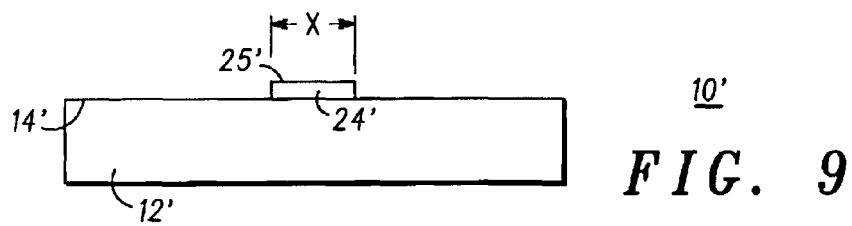

Illustrated in FIG. 8 is substrate 12', having formed thereon surface 14', patterning layer 18'. Subsequent to the baking of patterning layer 18', template layer 18' is exposed by standard optical or e-beam patterning techniques, thereby forming a first patterned layer, or patterned imageable relief structure, 24', having a dimension "x", as illustrated in FIG. 9. It is anticipated by this disclosure that exposure of layer 18' can be accomplished utilizing e-beam radiation, x-ray radiation, deep-ultra violet radiation, ion beam radiation, or any other suitable radiation that provides for the exposure of patterning layer 18'. First patterning layer 18' is radiated through to surface 14' of substrate 12'. Next, patterning layer 18' is washed in a developer to create the pattern by removal of any unexposed or non-radiated portions of patterning layer 18' if the imageable layer is negative acting, or by removal of exposed areas if the imageable layer is positive acting, resulting in a remaining patterned imageable relief layer 24' as illustrated in FIG. 9.

It is additionally anticipated by this disclosure the inclusion of an etch stop layer 21 within template 10' as illustrated in FIG. 8. In this instance, an etch stop layer is preferably formed on a surface 14' of substrate 12', sandwiched therebetween substrate 12' and first patterning layer 18'. Alternatively, etch stop layer 21 can be formed anywhere within the layers of template 10'. Etch stop layer 21, dependent upon the type of material it is comprised of would serve as either a charge dissipation layer, when formed of a conductive material, or a contrast enhancement layer when formed of a dielectric material. When etch stop layer 21 is formed for the purpose of charge dissipation, it is disclosed as being formed of a conductive material characterized as dissipating the charge during template fabrication and for the purpose of enabling e-beam exposure and inspection. More specifically, an etch stop layer, having charge dissipation properties, is disclosed as being formed of a conductive material such as aluminum (Al), copper (Cu), titanium (Ti), chrome (Cr), indium oxide ($InO_2$), tin oxide ($SnO_2$), indium tin oxide (ITO), zinc oxide ($ZnO_2$), cadmium oxide (CdO), copper aluminum oxide (CuAlO), copper gallium oxide (CuGaO), cadmium tin oxide (CdSnO), polyanaline, or any other conductive material that is selectively removable from the patterning layer and acts to dissipate charge. Etch stop layer 21, formed as a charge dissipation layer is disclosed as having a minimal thickness dependent upon the charge conductivity of the material used. Etch stop layer 21 having charge dissipation properties is formed to assist in the dissipation of charge during electron beam (e-beam) writing, or other radiation forms used to pattern the layers (discussed presently).

When etch stop layer 21 is formed for the purpose of contrast enhancement, it is disclosed as being formed of a material having optical inspection properties. More specifically, an etch stop layer having contrast enhancement properties, is disclosed as being formed of silicon nitride (SiN), silicon oxide ($SiO_2$), chrome oxide ($Cr_xO_y$), aluminum oxide ($Al_xO_y$), aluminum nitride ($Al_xN_y$), chrome nitride ($Cr_xN_y$), or any other material having contrast enhancement properties that would allow for optical inspection of template 10'.

Etch stop layer 21 is generally disclosed as having a thickness in a range of 1–1000 nm, and a preferred thickness of at least 5 nm. Etch stop layer 21 is formed by spin coating, sputtering, vapor deposition, or the like. In the particular embodiment illustrated in FIG. 8, charge etch stop layer 21 is formed of aluminum (Al), thereby exhibiting charge dissipation properties, which is deposited on patterning layer 18'.

It is anticipated by this disclosure that other materials may be included within template 10' and used as a means of charge dissipation or contrast enhancement whenever this is necessary such as with e-beam lithography, optical inspection, or the like. These materials must be formed very thin so as not to degrade resolution by interfering with the irradiation source. Since it may be desirable to later remove this etch stop layer, for processing convenience, a criterion for choosing a etch stop layer is ease of removal. Removal of this layer can be done using either wet or dry etch techniques. However, to maintain the high resolution of the resultant patterned relief layer, removal must be done in a way which is highly selective from the patterned relief layer. Aluminum (Al) is one example of a conductive and selectively removable material which can be removed by conventional aqueous basic developers when coated to a thickness of 100–200 Å.

Figure 10:
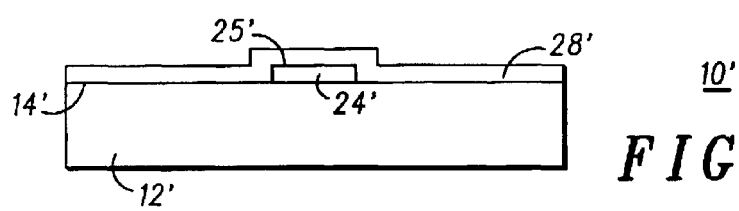

Referring now to FIG. 10, illustrated is a second patterning layer 28' deposited on an uppermost surface 25' of first patterned layer 24'. Second patterning layer 28' in a preferred embodiment is disclosed as being formed of an imageable dielectric material. More specifically, second patterning layer 28', like first patterning layer 18', is disclosed as being formed of an imageable oxide, such as hydrogen silsesquioxane (HSQ), marketed by Dow Corning as FOX-15®. In addition, second patterning layer 28' could be formed of alternative imageable dielectric materials, such as an imageable nitride, or an imageable oxynitride. During template fabrication, second patterning layer 28' is formed on surface 25' of first patterned layer 24' and then baked at a low temperature, such as approximately 160° C., to remove any solvents present. Next, patterning layer 28' is washed in a developer to create the pattern by removal of any unexposed or non-radiated portions of patterning layer 18' if the imageable layer is negative acting, or by removal of exposed areas if the imageable layer is positive acting, resulting in a remaining second patterned layer, or patterned imageable relief layer, 34' as illustrated in FIG. 11.

It should be understood that during the fabrication of template 10', chemical amplification may be employed in the chemistry of the imageable materials to lower radiation requirements. More specifically, where chemical amplification is proposed, a second bake step is generally, but not necessarily, utilized subsequent to the irradiation of first patterning layer 18' or second patterning layer 28'. In addition, a descumming process may be employed, including a light plasma etch, after the relief structure is formed to remove any residual transparent dielectric material, and specifically, any remaining first patterning layer 18' or second patterning layer 28', that remains in an area to be cleared.

Figure 11:
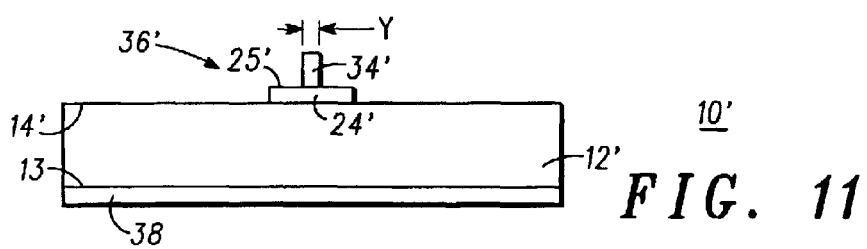

FIG. 11 illustrates in cross-sectional view, a complete multi-tiered lithographic template 10' including substrate 12' having surface 14', first patterned layer 24' having a surface 25' and a dimension "x", and second patterned layer 34' having a dimension "y", where "x" is greater than "y", overlying surface 25' of first patterned layer 24'. Upon completion, template 10' defines therein a multi-tiered relief image 36'. It should be understood that while described is relief image 36' having dual tiers, defined by first patterned layer 24' and second patterned layer 34', anticipated by this disclosure is the fabrication and inclusion of additional stacked patterned layers to define a relief image having greater than two tiers.

Furthermore, it is anticipated by this disclosure, the fabrication of a multi-tiered lithographic template, including a combination of the two previously disclosed techniques, in which a portion of the template layers are formed using standard lithographic processing techniques as previously described with respect to FIGS. 1–7, and a portion of the template layers are formed using directly imageable dielectric processing techniques as previously described with respect to FIGS. 8–11. More specifically, anticipated is a multi-tiered lithographic template in which formed is a first patterned layer using standard lithographic processing techniques as described with respect to FIGS. 1–7, and a second patterned layer formed using directly imageable dielectric processing techniques as described with respect to FIGS. 8–11, or vice versa, dependent upon the intended use for the completed template.

It is additionally disclosed that anticipated by this disclosure is the optional inclusion of a stress compensation layer (not shown), sandwiched within the layers that comprise structure 10 or 10' for the purpose of counteracting in-plane and/or out-of-plane distortion. More particularly, it is anticipated by this disclosure the inclusion of a stress compensation layer positioned anywhere within the template layers, such as on either side of first etch stop layer 16, on top of first patterned layer 24, or adjacent substrate 12' as illustrated in FIG. 11. In an alternate preferred embodiment, a stress compensation layer would be formed sandwiched between substrate 12 and first etch stop layer 16. In the instance where a stress compensation layer is included, it is anticipated that it would be formed of an oxide, a nitride, an oxynitride film, such as specifically $Si_xO_y$, $Si_xN_y$, SiON, or indium-tin-oxide (ITO), indium oxide ($InO_2$), tin oxide ($SnO_2$), zinc oxide ($ZnO_2$), cadmium oxide ($CdO_2$), copper aluminum oxide (CuAlO), copper gallium oxide (CuGaO), cadmium tin oxide (CdSnO), or any other transparent, or semi-transparent conducting material, and combinations thereof. The stress compensation layer is for the purpose of counteracting any exerted force upon the layers which comprise structure 10/10', causing bowing of the layers, or causing distortion of the formed features within the "x", "y", or "z" plane. The thickness of the stress compensation layer would range from 5 nm to 5 μm with a typical thickness of 200 nm. This thickness can be adjusted depending on the nature and type of film deposited and the stress compensating requirements of the film.

Additionally, and as illustrated in FIG. 11, further advantages for a stress compensation layer, illustrated as layer 38, are realized when stress compensation layer 38 is positioned on surface 13 of substrate 12'. In addition to serving as a stress compensation layer as previously described, stress compensation layer 38 now allows template 10' to be held electrostatically. Electrostatic chucking (holding) of template 10' restricts template 10' from moving during the writing process and also ensures that template 10' is held flat during lithographic exposure.

Figure 12:
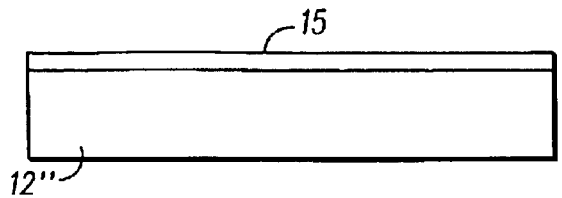
FIGS. 12–16 illustrate in cross-sectional views, steps in a third disclosed process for fabricating a multi-tiered lithographic template in accordance with the present invention.
Figure 13:
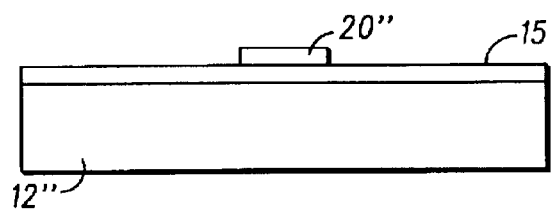

Illustrated in FIGS. 12–16 are steps in yet another alternative method of forming the multi-tiered lithographic template of the present invention. It should be noted that all components of FIGS. 12–16 that are similar to the components illustrated in FIGS. 1–7, are designated with similar numbers, having a double prime added to indicate the different embodiment. More specifically, illustrated in FIG. 12, is a template 10" comprised of a substrate 12". Substrate 12" is generally formed similar to substrate 12 and 12' previously described. Substrate 12" has formed on an uppermost surface 14", a hard mask layer 15. Hard mask layer 15 is formed by depositing a material layer comprised of chrome (Cr), molybdenum silicide (MoSi), tantalum (Ta), tantalum nitride (TaN), tantalum silicon nitride (TaSiN), or chrome nitride (CrN). Hard mask layer 15 serves as a charge dissipation layer during processing of template 10" and is therefore optional dependent upon the intended use for template 10".

Figure 14:
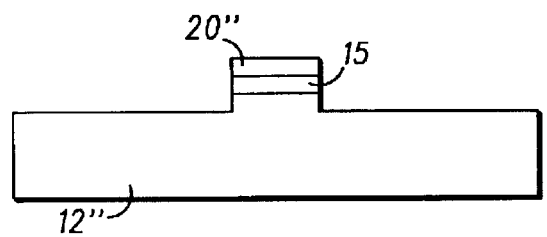
Figure 15:
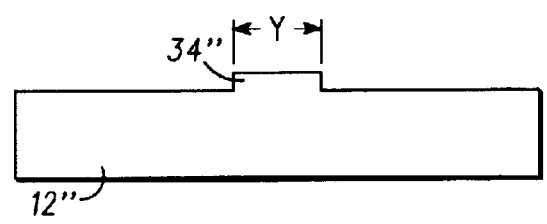
Figure 16:
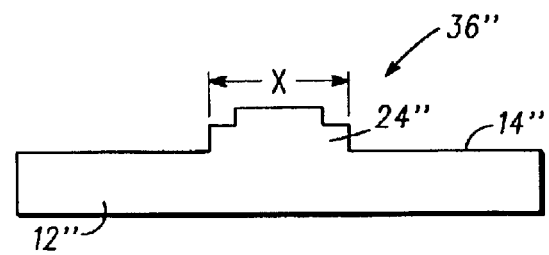

Illustrated in FIG. 12 is template 10" comprising substrate 12" and hard mask layer 15. Hard mask layer 15 has formed on an uppermost surface, a patterned resist layer 20", formed generally similar to patterned resist layer 20 of template 10, described previously, as illustrated in FIG. 13. During fabrication, and as illustrated in FIG. 14, patterned resist layer 20" provides for the etching therethrough of hard mask layer 15 and a portion of substrate 12". Subsequent to etching, patterned resist layer 20" and hard mask layer 15 are removed, thereby exposing substrate 12" having defined therein a relief structure 34" having a dimension "y". Subsequent processing steps including additional masking layers and patterned resist layers are performed to define therein substrate 12" a second relief structure 24" having a dimension "x", wherein dimension "x" is greater than dimension "y". As illustrated in FIG. 16, template 10" has defined in uppermost surface 14" of substrate layer 12" a multi-tiered patterned relief image 36". It should be understood that anticipated by this disclosure is the fabrication of a template having formed a first relief structure in an uppermost surface 14" of substrate 12" and having at least one additional relief structure formed thereon an uppermost surface of the first relief structure, utilizing standard lithographic processing techniques, or imageable dielectric processing techniques previously described with respect to template 10 and 10'.

Figure 17:
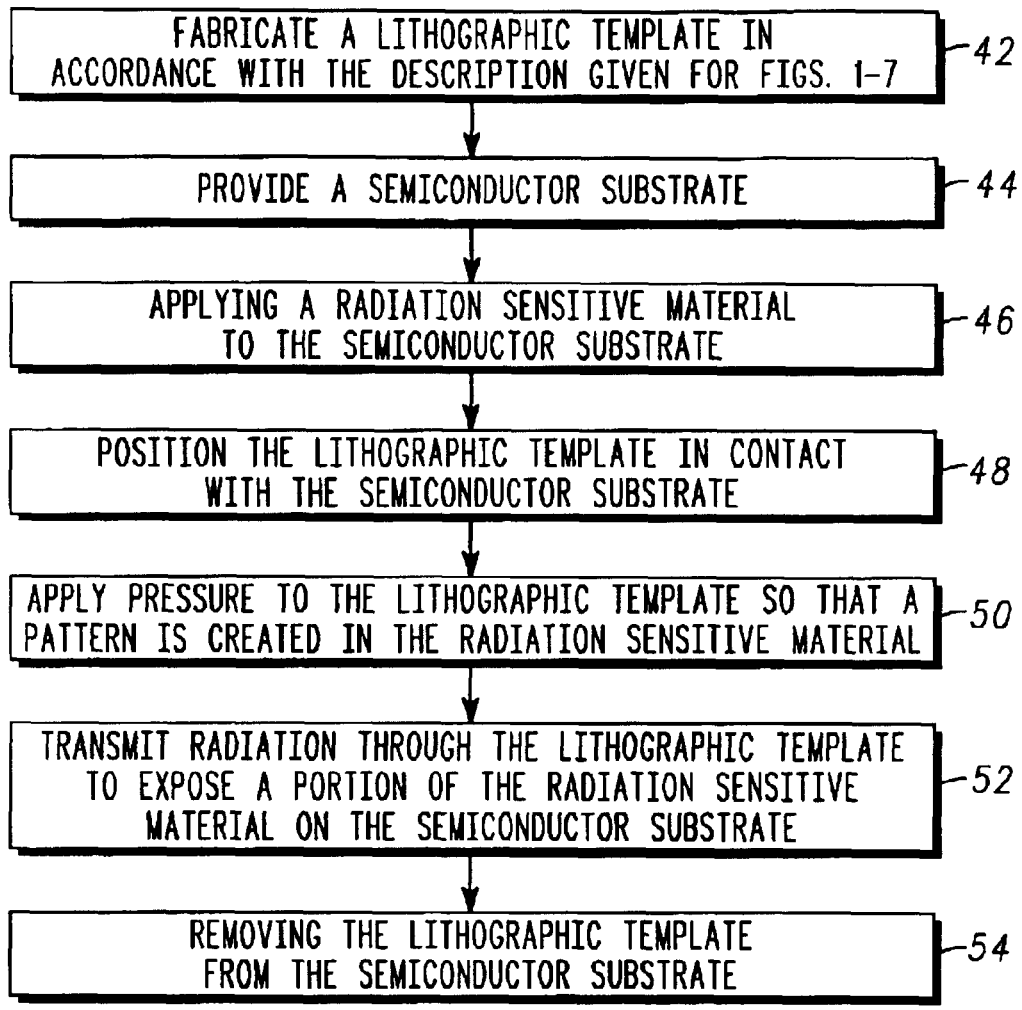
FIG. 17 is a simplified process flow diagram fabricating a semiconductor device with a multi-tiered lithographic template in accordance with the present invention.

Shown in FIG. 17 is a process flow diagram wherein a multi-tiered lithographic template, generally similar to multi-tiered template 10 of FIGS. 1–7, template 10' of FIGS. 8–11, or template 10" of FIGS. 12–16, fabricated in accordance with the present invention is used to fabricate a semiconductor device 40. Initially, a multi-tiered lithographic template is fabricated 42 in accordance with the description given for FIGS. 1–7, FIGS. 8–11 or FIGS. 12–16. Next, a semiconductor substrate 44 is provided. A radiation sensitive material is applied 46 to a semiconductor substrate, such as a photocurable organic layer or a photoresist layer. The semiconductor substrate may have overlying devices or device layer such as polysilicon, oxide, metal, etc., as well as trench and diffusion regions or the like. The radiation sensitive material layer coated semiconductor substrate is then placed adjacent and in contact 48 with the lithographic template. A slight pressure is applied 50 to the template so that the radiation sensitive material layer flows into the relief images on the template. Radiation is then transmitted 52 through the lithographic template, including the substrate, the etch stop layer(s), and the patterning layer(s) (for the cases when the patterning layer is transparent), and imaged onto the radiation sensitive material layer coated semiconductor substrate to further define and expose a pattern in the radiation sensitive material layer. The template is thereafter removed 54 from the semiconductor device, thereby leaving a patterned organic layer which is then used as an image layer for subsequent processing. The photoresist layer can then be used as a mask, either in conjunction with ion implantation to form implanted regions in the semiconductor substrate, or can be used in conjunction with conventional lift-off techniques, wet or dry etches to transfer the pattern into the semiconductor substrate, or into device layers overlying the semiconductor substrate. It should be understood that although the multi-tiered template fabricated in accordance with the present invention is described in the preferred embodiment as being used to fabricate a semiconductor device, that anticipated is the use of a template, generally similar to template 10 of FIGS. 1–7, 10' of FIGS. 8–11, or 10" of FIGS. 12–16 to form microelectronic devices, micro electro mechanical devices, microfluidic devices, and photonic devices.

The foregoing description and illustrations contained herein demonstrate many of the advantages associated with the present invention. In particular, the present invention provides for a multi-tiered template used in lithographic printing. In addition, the method of fabricating the multi-tiered template and multi-tiered template structure according to the present invention provide for a multi-tiered template in which inspection for sub-micron structures is achievable.

Thus it is apparent that there has been provided, in accordance with the invention, a multi-tiered lithographic template, and a method of its formation and use that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for forming a multi-tiered lithographic template comprising the steps of:
   forming a first relief structure having a surface; and
   forming a second relief structure on the surface of the first relief structure, the second relief structure having a surface and thereby defining a multi-tiered lithographic template.

2. A method for forming a multi-tiered lithographic template as claimed in claim 1 further including the step of forming additional relief structures on a surface of the second relief structure.

3. A method for forming a multi-tiered lithographic template as claimed in claim 1 wherein the steps of forming a first relief structure and a second relief structure includes forming the first relief structure and the second relief structure from a portion of a substrate layer.

4. A method for forming a multi-tiered lithographic template as claimed in claim 3 wherein the substrate layer is a transparent substrate.

5. A method for forming a multi-tiered lithographic template as claimed in claim 1 wherein the steps of forming a first relief structure and a second relief structure includes forming the first relief structure and the second relief structure as additional layers on an uppermost surface of a substrate layer.

6. A method for forming a multi-tiered lithographic template as claimed in claim 1 wherein the steps of forming a first relief structure and a second relief structure includes forming the first relief structure from a portion of a substrate layer, and forming the second relief structure as an additional layer on an uppermost surface of the first relief structure.

7. A method for forming a multi-tiered lithographic template as claimed in claim 1 wherein the steps of forming a first relief structure and a second relief structure includes forming the first relief structure and the second relief structure utilizing directly imageable dielectric processing techniques.

8. A method for forming a multi-tiered lithographic template as claimed in claim 1 wherein the steps of forming a first relief structure and a second relief structure includes forming the first relief structure and the second relief structure utilizing standard lithographic processing techniques.

9. A method for forming a multi-tiered lithographic template as claimed in claim 1 wherein the steps of forming a first relief structure and a second relief structure includes forming the first relief structure and the second relief structure utilizing a combination of directly imageable dielectric processing techniques and standard lithographic processing techniques.

10. A method for forming a multi-tiered lithographic template comprising the steps of:
    providing a transparent substrate, the substrate having a surface;
    depositing a hard mask layer on a surface of the substrate;
    forming a patterned resist layer on a surface of the hard mask layer;
    etching the hard mask layer and the substrate, thereby defining a first patterned relief structure in the substrate material;
    removing the patterned resist layer and the hard mask layer; and
    forming at least one additional patterned relief structure on an uppermost surface of the first patterned relief structure.

11. A method for forming a multi-tiered lithographic template as claimed in claim 10 wherein the step of depositing a hard mask layer includes the step of depositing a material layer of one of chrome (Cr), molybdenum silicide (MoSi), tantalum (Ta), tantalum nitride (TaN), tantalum silicon nitride (TaSiN), and chrome nitride (CrN).

12. A method for forming a multi-tiered lithographic template as claimed in claim 10 wherein the step of forming at least one additional patterned relief structure on an uppermost surface of the first patterned relief structure includes the steps of forming the at least one additional patterned relief structure using standard lithographic processing techniques.

13. A method for forming a multi-tiered lithographic template as claimed in claim 10 wherein the step of forming at least one additional patterned relief structure on an uppermost surface of the first patterned relief structure includes the steps of forming the at least one additional patterned relief structure using directly imageable dielectric processing techniques.

14. A method for forming a multi-tiered lithographic template as claimed in claim 10 wherein the step of forming the at least one additional patterned relief structure on an uppermost surface of the first patterned relief structure includes the steps of forming the at least one additional patterned relief structure in the substrate layer.

15. A method for forming a multi-tiered lithographic template comprising the steps of:
    providing a transparent substrate, the substrate having a surface;
    forming a first patterned layer on the surface of the substrate, the first patterned layer having a surface, and thereby defining a relief structure; and
    forming a second patterned layer on the surface of the first patterned layer, the second patterned layer defining a relief structure.

16. A method of forming a multi-tiered lithographic template as claimed in claim 15 further including the steps of forming additional patterned layers on a surface of the second patterned layer.

17. A method of forming a multi-tiered lithographic template as claimed in claim 15 wherein the steps of forming a first patterned layer and forming a second patterned layer include defining a first patterned layer having a dimension "x", and a second patterned layer having a dimension "y", wherein "x" is greater than "y".

18. A method for forming a multi-tiered lithographic template as claimed in claim 15 wherein the template is formed using standard lithographic processing techniques.

19. A method for forming a multi-tiered lithographic template as claimed in claim 15 wherein the template is formed using directly imageable dielectric processing techniques.

20. A method for forming a multi-tiered lithographic template as claimed in claim 15 wherein the template is formed using a combination of standard lithographic template processing techniques and directly imageable dielectric processing techniques.

21. A method for forming a multi-tiered lithographic template as claimed in claim 15 wherein the step of forming a first patterned layer on the surface of the substrate includes the steps of:
 forming a first etch stop layer on the substrate;
 forming a first patterning layer on the first etch stop layer;
 forming a patterned resist layer on the surface of the first patterning layer;
 etching the first patterning layer, thereby defining the first patterned layer; and
 removing the patterned resist layer.

22. A method for forming a multi-tiered lithographic template as claimed in claim 15 wherein the step of forming a second patterned layer on the surface of the first patterned layer includes the steps of:
 forming a second etch stop layer on a surface of the first patterned layer;
 forming a second patterning layer on the second etch stop layer;
 forming a patterned resist layer on the surface of the second patterning layer;
 etching the second patterning layer, thereby defining a second patterned layer; and
 removing the patterned resist layer.

23. A method for forming a multi-tiered lithographic template as claimed in claim 15 wherein the step of forming a first patterned layer on the surface of the substrate includes the steps of:
 forming a first patterning layer of a directly imageable dielectric material on the surface of the substrate;
 patterning the first patterning layer with a radiation source thereby forming the first patterned layer.

24. A method for forming a multi-tiered lithographic template as claimed in claim 15 wherein the step of forming a second patterned layer on the surface of the substrate includes the steps of:
 forming a second patterning layer of a directly imageable dielectric material on the surface of the substrate;
 patterning the second patterning layer with a radiation source thereby forming the second patterned layer.

25. A method for forming a multi-tiered lithographic template comprising the steps of:
 providing a transparent substrate, the substrate having a surface;
 forming a first etch stop layer on the substrate;
 forming a first patterning layer on the first etch stop layer;
 forming a patterned resist layer on the surface of the first patterning layer;
 etching the first patterning layer, thereby defining a first patterned layer;
 removing the patterned resist layer;
 forming a second etch stop layer on a surface of the first patterned layer;
 forming a second patterning layer on the second etch stop layer;
 forming a patterned resist layer on the surface of the second patterning layer;
 etching the second patterning layer, thereby defining a second patterned layer; and
 removing the patterned resist layer.

26. A method of forming a multi-tiered lithographic template as claimed in claim 25 wherein at least one of the first patterning layer and the second patterning layer is directly imageable.

27. A method of forming a multi-tiered lithographic template as claimed in claim 25 further including the steps of forming additional patterned layers.

28. A method of forming a multi-tiered lithographic template as claimed in claim 25 wherein the step of etching the first patterning layer includes the step of defining a first patterned layer having a dimension "x", and the step of etching the second patterning layer includes the step of defining a second patterned layer having a dimension "y", wherein "x" is greater than "y".

29. A method of forming a multi-tiered lithographic template as claimed in claim 25 wherein the step of providing a transparent substrate is further characterized as providing a substrate of one of a quartz material, a polycarbonate material, a calcium fluoride (CaF2) material, a magnesium fluoride (MgF2) material, or a pyrex material.

30. A method for forming a multi-tiered lithographic template as claimed in claim 25 wherein the step of forming a first etch stop layer includes forming the first etch stop layer of one of silicon nitride (SiN), silicon oxide (SiO2), chromium (Cr), chromium oxide (CrO), aluminum oxide (AlO), aluminum nitride (AlN), chromium nitride (CrN), indium-tin-oxide (ITO), indium oxide (InO2), tin oxide (SnO2), zinc oxide (ZnO2), cadmium oxide (CdO2), copper aluminum oxide (CuAlO), copper gallium oxide (CuGaO), and cadmium tin oxide (CdSnO).

31. A method for forming a multi-tiered lithographic template as claimed in claim 26 wherein the steps of forming a first patterning layer and a second patterning layer are further characterized as forming a first patterning layer and a second patterning layer of one of an opaque material or a transparent material.

32. A method for forming a multi-tiered lithographic template as claimed in claim 31 wherein the steps of forming a first patterning layer and a second patterning layer of an opaque material are further characterized as forming the first patterning layer and the second patterning layer of one of tungsten (W), tungsten silicide (WSi), tungsten silicon nitride (WSiN), tantalum (Ta), tantalum alloys, gold (Au), chrome (Cr), tantalum silicide (TaSi), titanium (Ti), titanium alloys, molybdenum (Mo), molybdenum silicide (MoSi), molybdenum alloys, or tantalum silicon nitride (TaSiN).

33. A method for forming a multi-tiered lithographic template as claimed in claim 31 wherein the steps of forming a first patterning layer and a second patterning layer of a transparent material are further characterized as forming the first patterning layer and the second patterning layer of one of silicon dioxide (SiO2), silicon nitride (SiN), indium tin oxide (ITO), or silicon oxy-nitride (SiON).

34. A method for forming a multi-tiered lithographic template comprising the steps of:
 providing a substrate, the substrate having an uppermost surface;
 providing a first patterning layer supported by the substrate;
 patterning the first patterning layer with a radiation source thereby forming a first patterned layer having a relief structure;

providing a second patterning layer supported by the first patterned layer; and patterning the second patterning layer with a radiation source thereby forming a first patterned layer having a relief structure.

35. A method for forming a multi-tiered lithographic template as claimed in claim 34 further including the step of forming an etch stop layer adjacent at least one of the first patterning layer and the second patterning layer.

36. A method for forming a multi-tiered lithographic template as claimed in claim 34 wherein the first patterning layer and the second patterning layer are formed of a directly imageable transparent dielectric.

37. A method for forming a multi-tiered lithographic template as claimed in claim 34 wherein the directly imageable transparent dielectric is one of an imageable oxide, an imageable nitride, and an imageable oxynitride.

38. A method for forming a multi-tiered lithographic template as claimed in claim 37 wherein the directly imageable oxide is hydrogen silsesquioxane (HSQ).

39. A method for forming a multi-tiered lithographic template as claimed in claim 34 wherein the step of patterning the first patterning layer and the second patterning layer includes patterning with an electron beam source.

40. A multi-tiered lithographic template comprising:
a substrate having a surface;
a first patterned layer having a dimension "x" formed on the substrate, and a second patterned layer having a dimension "y" formed on the first patterned layer, wherein dimension "x" is greater than dimension "y", the first patterned layer and the second patterned layer defining therein a relief image.

41. A multi-tiered lithographic template as claimed in claim 40 further including additional patterned layers.

42. A multi-tiered lithographic template as claimed in claim 40 wherein the transparent substrate is further characterized as one of a quartz material, a polycarbonate material, a calcium fluoride (CaF2) material, a magnesium fluoride (MgF2) material, or a Pyrex material.

43. A multi-tiered lithographic template as claimed in claim 40 further including an first etch stop layer formed on the surface of the substrate, the first etch stop layer formed between the substrate and the first patterned layer.

44. A multi-tiered lithographic template as claimed in claim 40 further including a second etch stop layer formed on the surface of the first patterned layer, the second etch stop layer formed between the first patterned layer and the second patterned layer.

45. A multi-tiered lithographic template as claimed in claim 40 wherein the first patterned layer and the second patterned layer are formed of one of an opaque material or a transparent material.

46. A multi-tiered lithographic template as claimed in claim 40 wherein the opaque first patterned layer and the opaque second patterned layer are formed of one of tungsten (W), tungsten silicide (WSi), tungsten silicon nitride (WSiN), tantalum (Ta), tantalum alloys, gold (Au), chrome (Cr), tantalum suicide (TaSi), titanium (Ti), titanium alloys, molybdenum (Mo), molybdenum silicide (MoSi), molybdenum alloys, or tantalum silicon nitride (TaSiN).

47. A multi-tiered lithographic template as claimed in claim 40 wherein the transparent first patterned layer and the transparent second patterned layer are formed of one of silicon dioxide (SiO2), silicon nitride (SiN), indium-tin-oxide (ITO), or silicon oxy-nitride (SiON).

48. A method for making a device comprising the steps of:
providing a substrate;
coating the substrate with a radiation sensitive material layer;
fabricating a multi-tiered lithographic template, wherein the lithographic template comprises;
a substrate having a surface; and
a first patterned layer having a dimension "x" formed on the substrate, and a second patterned layer having a dimension "y" formed on the first patterned layer, wherein dimension "x" is greater than dimension "y", the first patterned layer and the second patterned layer defining therein a relief image;
positioning the lithographic template in contact with the radiation sensitive material layer, the radiation sensitive material layer being between the template and the substrate;
applying pressure to the template, the radiation sensitive material thereby flowing into the relief pattern on the template;
transmitting radiation through the lithographic template to expose at least a portion of the radiation sensitive material layer on the substrate, thereby further affecting the pattern in the radiation sensitive material layer; and
removing the template from the substrate.

49. A method for making a device as claimed in claim 48 wherein the step of transmitting radiation through the multi-tiered lithographic template is further characterized as transmitting ultraviolet light through the multi-tiered lithographic template.

50. A method for making a device as claimed in claim 48 wherein the step of transmitting radiation through the multi-tiered lithographic template is further characterized as transmitting deep ultraviolet light through the multi-tiered lithographic template.

51. A method for making a device as claimed in claim 48 wherein the radiation sensitive material layer is further characterized as coating the substrate with a photocurable material layer.

52. A method for making a device as claimed in claim 48 wherein the device is one of a semiconductor device, a microelectronic device, a micro electro mechanical device, a microfluidic device, or photonic device.

* * * * *